United States Patent
Inokuchi

(10) Patent No.: US 7,142,055 B2
(45) Date of Patent: Nov. 28, 2006

(54) BUFFER CIRCUIT AND DRIVER IC

(75) Inventor: Hiroyuki Inokuchi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 10/686,130

(22) Filed: Oct. 14, 2003

(65) Prior Publication Data
US 2004/0075500 A1   Apr. 22, 2004

(30) Foreign Application Priority Data
Oct. 16, 2002   (JP)   ............... 2002-301373

(51) Int. Cl.
*H03F 3/45* (2006.01)
(52) U.S. Cl. .................. 330/253; 330/69; 330/260
(58) Field of Classification Search ................ 330/253, 330/260, 51, 60, 85
See application file for complete search history.

(56) References Cited
U.S. PATENT DOCUMENTS 5,923,219 A * 7/1999 Ide et al. .................... 330/308
6,091,294 A * 7/2000 Shirai et al. .................. 330/69
6,285,256 B1 * 9/2001 Wong .......................... 330/255
6,310,520 B1 * 10/2001 Walden ....................... 330/253

* cited by examiner

*Primary Examiner*—Khanh Van Nguyen
(74) *Attorney, Agent, or Firm*—Merchant & Gould P.C.

(57) ABSTRACT

A load is commonly driven by means of operational amplification means which buffers an input voltage and produces an output voltage; and by means of output acceleration means which outputs a large electric current greater than the electric current output from the operational amplification means when a voltage difference of a predetermined offset voltage or more exists between the input and output voltages. As a result, when a change has arisen in the input voltage, the electric current is supplied to the load primarily from the output acceleration circuit until the difference between the input and output voltages becomes the predetermined offset voltage or less. Subsequently, the electric current is caused to flow to the load from the operational amplification means until the input and output voltages become equal to each other.

6 Claims, 6 Drawing Sheets

FIG. 1
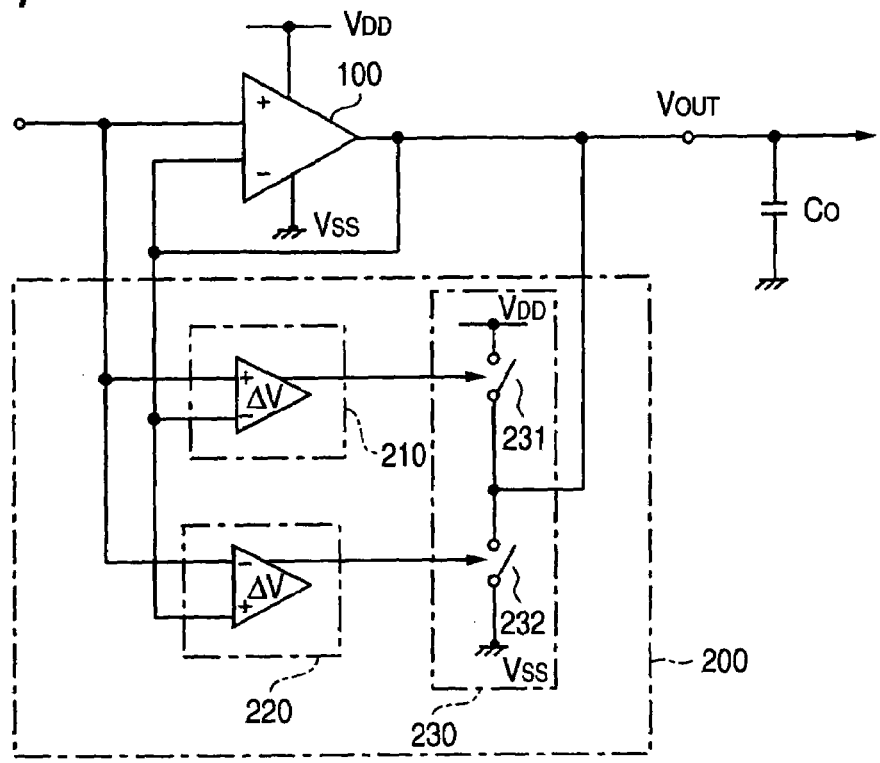
FIG. 2 (a)
FIG. 2 (b)
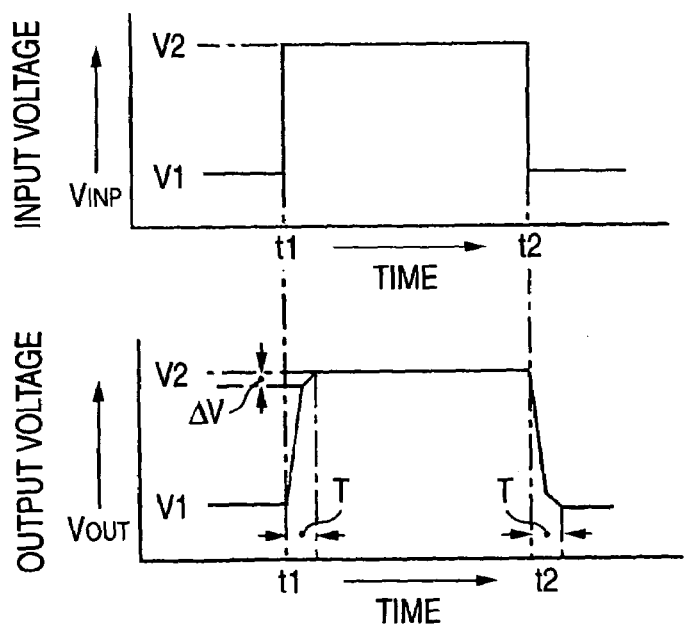

BUFFER CIRCUIT AND DRIVER IC

BACKGROUND OF THE INVENTION

1. Field of the Invention

The invention relates to a buffer circuit using a low electric-current-consumption-type operational amplifier and to a driver IC having many buffer circuits.

2. Description of the Related Art

In many cases, a buffer circuit using an operational amplifier is used for a driver IC for use with a source drive provided in a liquid-crystal display device (LCD) or an organic EL display device. In accordance with an increase in the size of a display panel, demand exists for a driver IC with a buffer circuit which achieves large-capacity drive capability, a decrease in power consumption, and a high-speed output response. An output voltage of the driver IC must be controlled over a wide range from a ground potential to levels in the vicinity of a source potential.

FIG. 6 is a view showing the configuration of a related-art operational amplifier 500 of rail-to-rail type such as disclosed in IEICE transactions, 2001/5 Vol. J84-C No. 5 pg. 364 FIG. 15. FIG. 7 shows a buffer circuit formed by connecting an output voltage Vout of the operational amplifier 500 directly to an inverted input terminal (−) thereof, thus constituting a buffer circuit and driving a load capacitor Co. FIGS. 8A and 8B show time characteristics of input and output voltages in the buffer circuit shown in FIG. 7.

In FIG. 6, reference numerals 501 to 510 designate MOSFETs, and MOSFETs whose gates are given circles are p-type MOSFETs (hereinafter abbreviated as "PMOS transistors"). The remaining MOSFETs are n-type MOSFETs (hereinafter abbreviated as "NMOS transistors"). Reference numerals 511 to 514 designate constant current sources for causing electric currents Iss1 to Iss4 to flow. Reference numerals Vb51 to Vb53 denote bias voltages.

The related-art buffer circuit employs a PMOS transistor and an NMOS transistor as input terminals. When the input voltage Vinp is considerably low, the NMOS transistors 501, 502 are brought into a cut-off state, whereby the electric current Iss2 assumes a value of zero. Hence, the input transistor is actuated by means of only the PMOS transistors 509, 510. In contrast, when the input voltage Vinp is considerably high, the PMOS transistors 509, 510 enter a cut-off state, and the electric current Iss1 assumes a value of 0. Therefore, the input transistors are actuated by means of only the NMOS transistors 501, 502. When the input voltage Vinp falls within the remaining range outside these ranges, both input transistors; that is, the PMOS transistors 509, 510 and the NMOS transistors 501, 502, operate. In this way, the input transistors can operate at the input voltage Vinp in the full range (i.e., a rail-to-rail range) from the ground potential Vss to the source potential Vdd, by means of the related-art buffer circuit.

In order to achieve a reduction in power consumption, the related-art buffer circuit must reduce current values Iss1 to Iss4 of constant current sources 511 to 514. Particularly, when battery cells are used as the power source as in the case of a portable device, a reduction in power consumption is an important consideration.

In a case where the load capacitor Co is activated by means of a related-art buffer circuit, when the input voltage Vinp has changed in a rectangular pattern between a voltage V1 and a voltage V2, as can be seen from a time characteristic chart of the input voltage shown in FIG. 8A and a time characteristic chart of the output voltage shown in FIG. 8B, the output voltage Vout requires consumption of a rise time T1 from the voltage V1 to the voltage V2 and consumption of a fall time T2 from the voltage V2 to the voltage V1. The times T1, T2 are dependent on a decline $\alpha$ determined by a ratio of the electrostatic capacity of the load capacitor Co to the current value Iss4 of the constant current source 514.

The electrostatic capacitance of the load capacitor Co is determined by a display panel to be driven by the buffer circuit. When the current value of the constant current source is reduced for reducing power consumption, a limitation is imposed on the driving capability of the buffer circuit, and hence the rise and fall of the output voltage involve consumption of a time, thereby posing difficulty in realization of a high-speed output response. An attempt to realize high-speed output response can be made by increasing the current value of the constant current source. However, in this case a large current is caused to flow at all times, which in turn results in an increase in power consumption. A reduction in power consumption and large-capacity driving capability and the high-speed output response are competing objectives, and difficulty is encountered in attaining both improvements.

SUMMARY OF THE INVENTION

Therefore, the invention aims at providing a buffer circuit which enables large-capacity driving capability, high-speed output response, and a reduction in power consumption by addition of a circuit which operates so as to reduce a current value of a constant current source in a stationary state and to supply or absorb a load current only when a change has arisen in a state.

A buffer circuit of the first aspect in this invention is characterized by comprising:

operational amplification means which is configured to input an input voltage to a non-inverted input terminal and inputs a voltage output from an output terminal to a reverse input terminal through feedback; and output acceleration means which receives the input voltage and the output voltage as differential inputs and, when a difference exceeding a predetermined offset voltage exists between the two inputs, outputs to the output terminal an electric current larger than the current output from the operational amplification means.

A buffer circuit of the second aspect in this invention is characterized by the buffer circuit of the first aspect, in which the output acceleration means has a differential amplification section having the predetermined offset voltage, and a switching section which is connected between a source potential and the output terminal and is activated or deactivated in accordance with an output from the differential amplification section.

A buffer circuit of the third aspect in this invention is characterized by the buffer circuit of the second aspect, in which the differential amplification section has a first differential amplification circuit which produces a first output when the input voltage is higher than the output voltage by an amount corresponding to a first offset voltage, and a second differential amplification circuit which produces a second output when the output voltage is higher than the input voltage by an amount corresponding to a second offset voltage; and wherein the switching section has a first switching circuit which is connected between a first source potential and the output terminal and is activated or deactivated in accordance with the first output, and a second switching circuit which is connected between the output terminal and a second source potential and is activated or deactivated in accordance with the second output.

A buffer circuit of the fourth aspect in this invention is characterized by the buffer circuit of claim 2, in which the operational amplification means is formed such that an electric current output from a first source potential to the output terminal is limited to a predetermined current value and such that an electric current output from the output terminal to a second source potential flows by way of the switching circuit; and wherein the output acceleration means has a differential amplification section having the predetermined offset voltage and a switching section which is connected between the first source potential and the output terminal and is activated or deactivated in accordance with an output from the differential amplification section.

A buffer circuit of the fifth aspect in this invention is characterized by comprising a plurality of the buffer circuits in use of a driver IC as defined in the first to fourth aspects.

BRIEF DESCRIPTION OF THE DRAWINGS

FIG. 1 is a view showing the configuration of a buffer circuit according to a first embodiment of the invention;

FIGS. 2(a) and 2(b) show the views showing a response characteristic of an output voltage relative to a change in an input voltage shown in FIG. 1;

DESCRIPTION OF THE PREFERRED EMBODIMENTS

An embodiment of a buffer circuit according to the invention and that of a driver IC having the buffer circuit according to the invention will be described hereinbelow by reference to the drawings.

Figure 3:
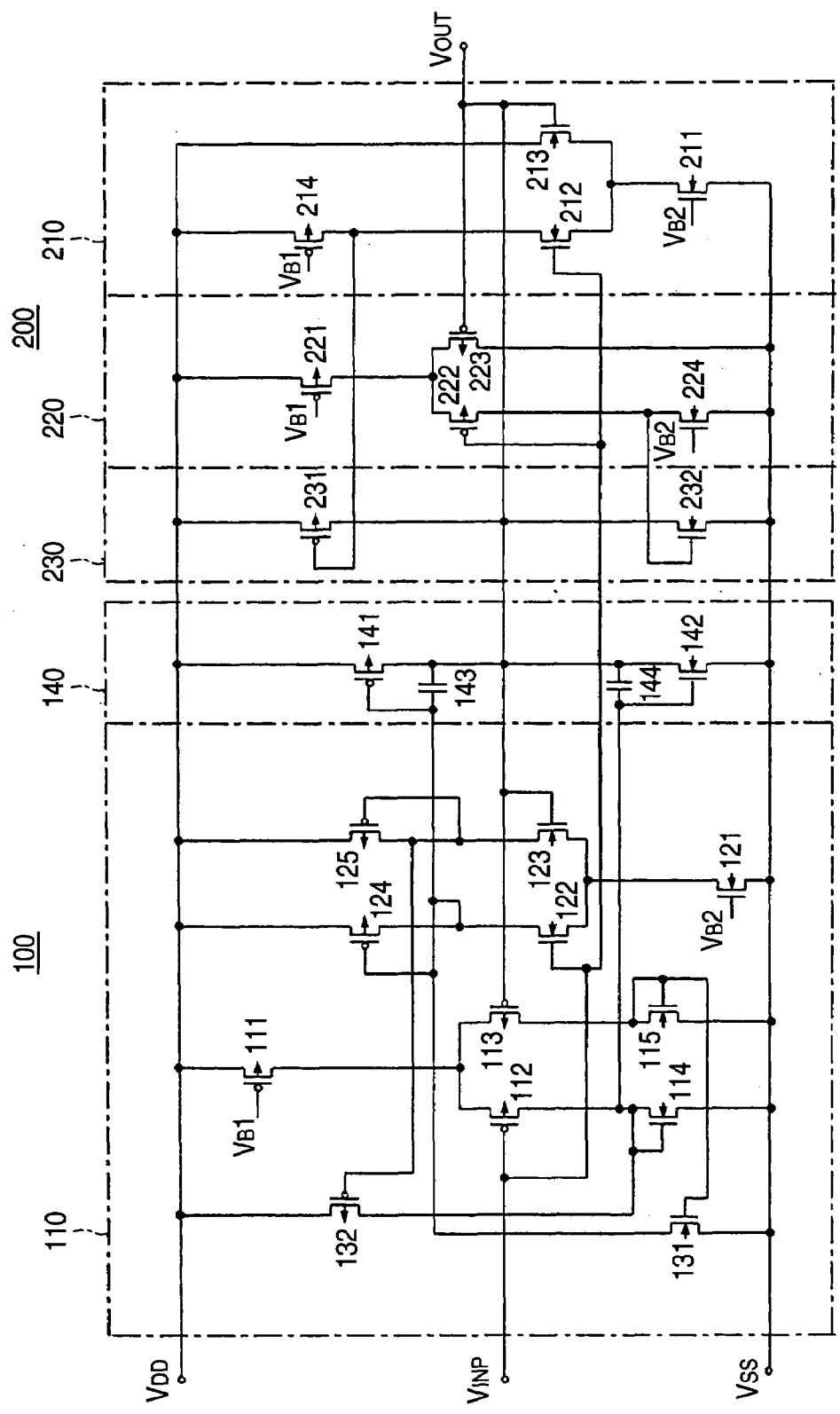
FIG. 3 is a view showing an example of a specific circuit configuration of the buffer circuit shown in FIG. 1.

FIG. 1 is a view showing the configuration of a buffer circuit according to a first embodiment of the invention; FIG. 2 is a view showing a response characteristic of an output voltage relative to a change in a voltage input to the buffer circuit; and FIG. 3 is a view showing an example of a specific circuit configuration of the buffer circuit shown in FIG. 1.

In FIG. 1, an operational amplifier 100 is driven by means of a voltage developing between a first source potential Vdd and a second source potential (hereinafter called a "ground potential") Vss. The input voltage Vinp is input to a non-inverted input terminal (+), and an output voltage Vout of the output terminal is fed back directly to the inverted input terminal (−). Specifically, the operational amplifier 100 is connected in the form of a voltage follower. The output voltage Vout is supplied to a load side, to thereby recharge the load capacitor Co, which is representative of a load. Here, the input voltage Vinp and the output voltage Vout are determined with reference to a ground potential.

The operational amplifier 100 includes a plurality of constant current sources, and output current of the operational amplifier 100 is limited to a current value of the constant current source. A small current is output when the output voltage Vout is lowered (i.e., when the load capacitor Co is discharged) as well as when the output voltage Vout is raised (i.e., when the load capacitor Co is recharged). When the operational amplifier 100 is of rail-to-rail type, the output current is supplied until the output voltage Vout reaches a first source potential Vdd or a ground potential Vss in accordance with the input voltage Vinp.

An output acceleration circuit (hereinafter called an "enhancer") 200 is constituted of an enhancer-rise-side input stage circuit 210, an enhancer-fall-side input stage circuit 220, and an enhancer output stage circuit 230.

The rise-side input stage circuit 210 is constituted of a differential amplifier circuit having a predetermined offset voltage $\Delta V$. The input voltage Vinp is input to a positive (+) input side of the differential amplification circuit, and the output voltage Vout is input to a negative (−) input side of the same. When the input voltage Vinp is greater than the output voltage Vout by more than the offset voltage $\Delta V$, a first differential output is output. The fall-side input stage circuit 220 is formed from a differential amplification circuit having a predetermined offset voltage $\Delta V$ (may be equal to the offset voltage of the rise-side input stage circuit 210 or may assume a value different from the offset voltage). The output voltage Vout is input to the positive (+) input side, and the input voltage Vinp is input to the negative (−) input side. When the output voltage Vout is greater than the input voltage Vinp by more than the offset voltage $\Delta V$, a second differential output is output.

The enhancer output stage circuit 230 is formed by connecting in series a first switch 231 to be activated or deactivated in accordance with a first differential output, and a second switch 232 to be activated or deactivated in accordance with a second differential output, between the first source potential Vdd and the ground potential Vss. A series node existing between the first switch 231 and the second switch 232 is connected to an output terminal of the operational amplifier 100, and an output current greater than that output from the operational amplifier 100 is output to the load.

The operation of the buffer circuit shown in FIG. 1 will now be described by reference to FIG. 2, which shows a response characteristic of the output voltage Vout relative to a change in the input voltage Vinp.

Before a point of time t1 shown in FIG. 2, both the input voltage Vinp and the output voltage Vout remain at a low voltage V1 by means of voltage follower operation of the operational amplifier 100. In this stage, the rise-side input stage circuit 210 and the fall-side input stage circuit 220 fail to output the first and second differential outputs. Hence, both first and second switches 231 and 232 remain deactivated.

When the input voltage Vinp has changed to a higher voltage V2 at a point in time t1, the operational amplifier 100 operates such that the output voltage Vout follows the input voltage Vinp. At this time, the operational amplifier 100 outputs a small electric current, because the output current is limited to the current value of the constant current source. In contrast, a potential difference between two inputs of the rise-side input stage circuit 210 exceeds the offset voltage $\Delta V$ (i.e., Vinp−Vout>$\Delta V$). Hence, a first differential output is produced, and the first switch 231 is activated. As a result, the load capacitor Co is recharged with the electric current flowing from the first source potential Vdd to first switch 231. The recharging current stemming from the first source potential Vdd is greater than the current output from the operational amplifier 100. Hence, as illustrated, the load capacitor Co is recharged immediately until the voltage difference between the two inputs of the rise-side input stage circuit 210 becomes equal to the offset voltage ΔV.

When the voltage difference between the two inputs of the rise-side input stage circuit 210 becomes equal to the offset voltage ΔV, the first differential output is not produced, whereupon the first switch 231 is deactivated. Subsequently, the load capacitor Co is recharged until the output voltage Vout becomes equal to the input voltage Vinp by means of voltage follower operation of the operational amplifier 100.

A time T from when the input voltage Vinp has changed from the voltage V1 to the voltage V2 at the point in time t1 until the output voltage Vout follows to become the voltage V2 becomes a sum of the time during which the output voltage Vout reaches a voltage (V2−ΔV) which is lower than the voltage V2 by the offset voltage Δ from the voltage V1 and a time during which the output voltage reaches the voltage V2 from that voltage. The time T becomes considerably shorter than the time required when the load capacitor Co is recharged with only the operational amplifier 100.

When the input voltage Vinp has changed from the high voltage V2 to the low voltage V1 at a point in time t2, the output voltage Vout also operates so as to follow the input voltage Vinp. At this time, a voltage difference between two inputs of the fall-side input stage circuit 220 exceeds an offset voltage ΔV (Vout−Vinp>ΔV). Hence, the second differential output is output, to thereby activate the second switch 232. As a result, electric charges of the load capacitor Co are discharged by means of the electric current flowing through the second switch 232 to the ground potential Vss. The current discharged to the ground potential Vss is greater than the electric current discharged to the operational-amplifier 100. Hence, the load capacitor Co is immediately discharged as illustrated until the voltage difference between the two inputs of the fall-side input stage circuit 220 becomes equal to the offset voltage ΔV.

When the voltage difference between the two inputs of the fall-side input stage circuit 220 becomes equal to the offset voltage ΔV, the second differential output is not produced, and the second switch 232 becomes deactivated. Subsequently, the load capacitor Co is recharged until the output voltage Vout becomes equal to the input voltage Vinp by means of the voltage follower operation of the operational amplifier 100.

The time T from when the input voltage Vinp has changed from the voltage V2 to the voltage V1 at the point in time t2 until the output voltage Vout follows to become the voltage V1 is considerably shorter than that required when the load capacitor Co is discharged by means of only the operational amplifier 100.

FIG. 3 is a view showing a specific example of a circuit configuration of the buffer circuit shown in FIG. 1. The operational amplifier 100 is of rail-to-rail type and has an input stage circuit 110 and an output stage circuit 140. The enhancer 200 is a representation of the circuit shown in FIG. 1 in the form of a more specific circuit. In FIG. 3, from among MOSFETs 111 to 115, 121 to 125, 131 and 132, and 141 to 142 in the operational amplifier 100 and MOSFETs 211 to 214, 221 to 224, and 231 and 232 of the enhancer 200, MOSFETs whose gates are given circles are PMOS transistors, and the other MOSFETs are NMOS transistors. The same also applies to any counterparts in the following embodiments. Capacitors 143, 144 are for preventing occurrence of oscillation and are formed from MOSFETs.

In FIG. 3, the differential amplification circuit—which is located in the input stage circuit 110 of the operational amplifier 100 and formed from the FETs 111 to 115—is a low-voltage-side differential amplification circuit which operates within a voltage range from the lowest input voltage Vinp (i.e., the ground potential Vss) to a level determined by subtracting the threshold voltages of the FETs from the first source potential Vdd. A differential amplification circuit formed from FETs 121 to 125 is a high-voltage-side differential amplification circuit which operates within a voltage range from the highest input voltage Vinp (i.e., the first source potential Vdd) to a level which is higher than the ground potential Vss by the threshold voltages of the FETs. Vb1, Vb2 designate predetermined bias voltages. Consequently, the differential amplification circuits operate at a constant current. FETs 131, 132 are FETs for loopback operation of the respective differential amplification circuits.

In the output stage circuit 140 of the operational amplifier 100, the PMOS transistor 141 constitutes a current mirror circuit in conjunction with the PMOS transistor 124 of the high-voltage-side differential amplification circuit. The NMOS transistor 142 constitutes a current mirror circuit in conjunction with the NMOS transistor 114 of the low-voltage-side differential amplification circuit.

Electric currents of the respective differential amplification circuits of the rail-to-rail-type operational amplifier 100 are suppressed to small current values for reducing static current consumption. The PMOS transistor 141 and the NMOS transistor 142, both being provided at the output stage, constitute a current mirror circuit in conjunction with the PMOS transistor 124 and the NMOS transistor 114 of the differential amplification circuit. Hence, the electric current is suppressed to a small current value.

The operational amplifier 100 operates over the entire range from the first source potential Vdd to the ground potential Vss. Since the operating current has been reduced, a reduction in power consumption is achieved. Further, since the electric current of the output stage has also been reduced, the load drive capability is diminished, and a drop arises in a through rate.

The enhancer 200 is added to the operational amplifier 100 for compensating for a drop in the through rate thereof. The function of the enhancer 200 is as described in connection with FIGS. 1 and 2. In relation to the specific configuration of the enhancer 200, the rise-side input stage circuit 210 is constituted of a differential amplification circuit including the MOSFETs 211 to 214. The rise-side input stage circuit 210 is given the offset voltage ΔV in such a way that the NMOS transistor 212 operates only when the input voltage Vinp applied to the gate of the NMOS transistor 212 is greater than the output voltage Vout applied to the gate of the NMOS 213 by a predetermined offset voltage ΔV.

When the source voltage is, e.g., five volts, it is better to set the offset voltage ΔV to 0.1 V to 0.2 V or thereabouts. The setting method is implemented by means of setting a difference in number between the NMOS transistor 212 and the NMOS transistor 213, both constituting the differential transistor; for example, the NMOS transistor 212 being formed from one transistor element, and the NMOS transistor 213 being formed from four transistor elements connected in parallel. Usually, the only requirement for producing the offset voltage ΔV is to cause a mismatch between the NMOS transistor 212 and the NMOS transistor 213. Therefore, there can be employed a method for producing a difference between the NMOS transistors 212 and 213 in terms of the number of transistor elements or the dimension of transistor elements or a method for inserting a resistor into one of the NMOS transistors 212, 213.

The fall-side input stage circuit 220 is constituted of a differential amplification circuit formed from the MOSFETs 221 to 224. The offset voltage $\Delta V$ is imparted to the fall-side input stage circuit 220 such that the PMOS transistor 222 operates only when the input voltage Vinp applied to the gate of the PMOS transistor 222 is lower than the output voltage Vout applied to the gate of the PMOS transistor 223 by a predetermined offset voltage $\Delta V$.

In the output stage circuit 230, the PMOS transistor 231 serving as a first switch is activated by means of a first differential output produced by the rise-side input stage circuit 210. The NMOS 232 serving as a second switch is activated by means of a second differential output produced by the fall-side input stage circuit 220.

Operation of the enhancer 200 will now be described by reference to FIG. 3. First, when the input voltage Vinp and the output voltage Vout are equal to each other; for example, a ground potential Vss, both the NMOS transistors 212 and 213 remain deactivated.

Consideration is given to a case where the input voltage Vinp has changed from the ground potential Vss to the first source potential Vdd, and the input voltage Vinp becomes higher than the output voltage Vout by the offset voltage $\Delta V$ or more in the rise-side input stage circuit 210. As a result, the NMOS transistor 212 becomes active, and the drain potential of the PMOS transistor 214 falls from the first source potential Vdd. Consequently, the PMOS transistor 231 becomes active, and the load capacitor Co is recharged with the electric current flowing from the first source potential Vdd to the PMOS transistor 231 within a short period of time, whereupon the output voltage Vout makes a pulse-like response and rises immediately.

At a point in time at which the output voltage Vout has reached a level which is lower than the input voltage Vinp by the offset voltage $\Delta V$, the NMOS transistor 212 becomes deactivated. In association with deactivation of the NMOS transistor 212, the PMOS transistor 231 also becomes deactivated. At this point in time, a voltage difference existing between the input voltage Vinp and the output voltage Vout corresponds to the offset voltage $\Delta V$. By means of the voltage difference, the load capacitor Co is recharged with a constant current passing through the PMOS transistor 141 of the output stage circuit 140, and the output voltage Vout reaches the input voltage Vinp through a linear response.

Even when the input voltage Vinp has changed from the first source potential Vdd to the ground potential Vss, similar operation is performed by means of the fall-side input stage circuit 220 and the output stage circuit 230.

According to the test data, when the load capacitor Co has a capacitance of 147 µF and the input voltage Vinp has been changed from 0.1 V to 4.9 V, the output voltage Vout responses within 4 µs. A stationary circuit current obtained at this time is 7 µA. A future additional reduction in current consumption also becomes feasible. This circuit measures 45 µm×25 µm and is effective as a buffer circuit for use in a TFT-LCD for which miniaturization is sought.

As mentioned above, when the current output from the operational amplifier 100 is limited to a small current value at both the rise and fall sides of the output voltage Vout, the output voltage Vout is produced immediately in response to a variation in the input voltage Vinp, and the overall power consumption of the buffer circuit can be diminished. If a driver IC is constituted of hundreds of buffer circuits, there can be realized a driver IC for use with a source drive of a display device, wherein the driver IC involves low power consumption, has high-capacity driving capability, and enables high-speed response.

Figure 4:
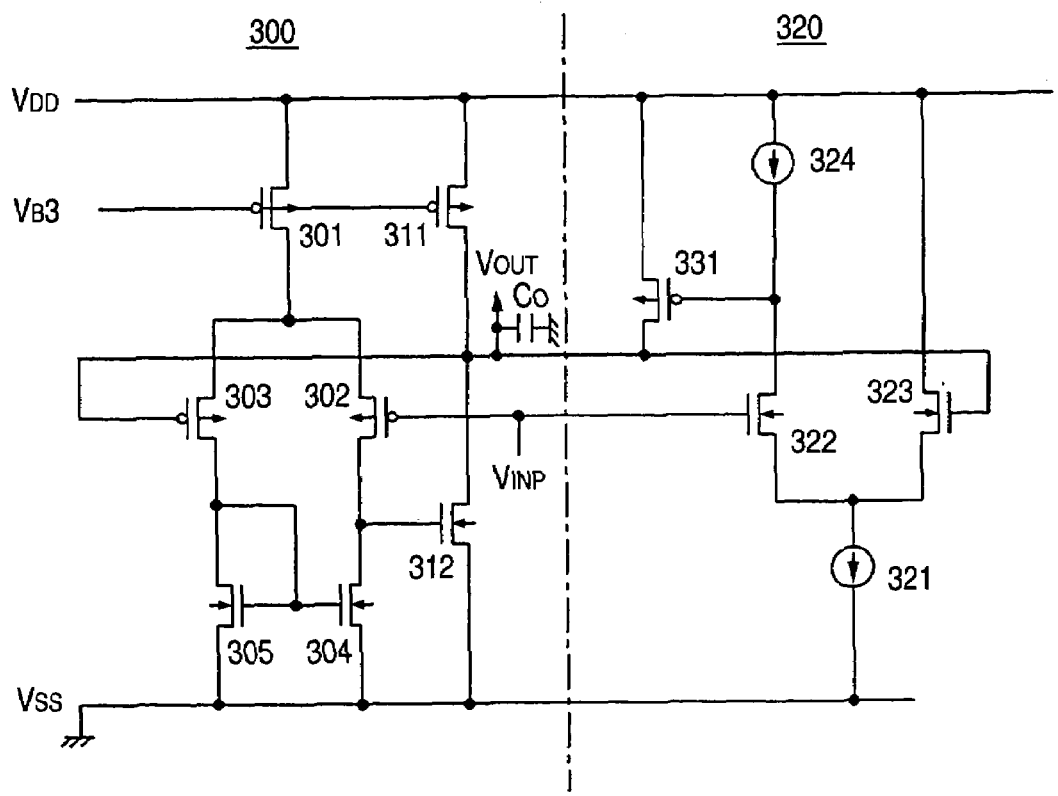
FIG. 4 is a view showing the configuration of a buffer circuit according to a second embodiment of the invention.

FIG. 4 is a view showing the configuration of a buffer circuit according to a second embodiment of the invention. In the second embodiment shown in FIG. 4, an operational amplifier 300 connected in the form of a voltage follower is configured so as to output an electric current of magnitude limited relative to the rise-side of the output voltage Vout and to induce an electric current which is not substantially limited by a switching circuit relative to the fall-side of the output voltage Vout. The enhancer 320 is configured so as to accelerate an output relative to solely the rise-side of the output voltage Vout in response to the configuration of the operational amplifier 300.

In FIG. 4, the operational amplifier 300 has a differential amplification circuit made up of MOSFETs 301 to 305, and an output section made up of MOSFETs 311, 312. The input voltage Vinp is input to the non-inverted input terminal, and the output voltage Vout is fed back to the reverse input terminal. A given bias voltage Vb3 is applied to the gate of the PMOS transistor 301 and the gate of the PMOS transistor 311, whereby the PMOS transistors 301, 311 operate as a constant current source. Further, NMOS transistors 304, 305 are configured so as to constitute a current mirror circuit.

The enhancer 320 has a differential amplification circuit which is made up of NMOS transistors 322, 323 and constant current sources 321, 324 and has the offset voltage $\Delta V$; and a switching circuit formed from a PMOS 331. The differential amplification circuit is provided with the offset voltage $\Delta V$ such that the NMOS transistor 322 operates when the input voltage Vinp applied to the gate of the NMOS transistor 322 is greater than the output voltage Vout applied to the gate of the NMOS transistor 323 by a predetermined offset voltage $\Delta V$.

In the buffer circuit shown in FIG. 4, the electric current obtained when the buffer circuit remains stationary is set to a low value, to thereby diminish power consumption achieved in the stationary state in which the input voltage Vinp is equal to the output voltage Vout. Under the assumption that the input voltage Vinp has arisen from the stationary state by the amount corresponding to the offset voltage $\Delta V$ or more, the electric current which can be supplied from the PMOS transistor 311 is a small low current, and hence the load capacitor Co cannot be recharged quickly with that current.

In the enhancer 320, when the input voltage Vinp is larger than the output voltage Vout by the amount corresponding to the offset voltage $\Delta V$ or more, the NMOS transistor 322 becomes activated, and the drain potential of the transistor drops. As a result, the PMOS transistor 331 becomes activated.

As a result, the load capacitor Co is quickly recharged with a large current flowing through the PMOS transistor 331. Quick recharging operation is completed at a point in time when the output voltage Vout has become lower than the input voltage Vinp by the amount corresponding to the offset voltage $\Delta V$. Subsequently, the load capacitor Co is recharged with the constant current output from the PMOS transistor 311 in accordance with the driving capability of the buffer circuit such that the output voltage Vout becomes equal to the input voltage Vinp. When recharging of the load capacitor Co has been completed, the buffer circuit enters a stationary state.

When the input voltage Vinp has dropped from the stationary state, the NMOS transistor 312 becomes active, whereby the electric charge of the load capacitor Co is immediately discharged, and the buffer circuit operates such that the output voltage Vout becomes equal to the input voltage Vinp. Hence, the buffer circuit performs high-speed response even when the enhancer 320 is not accelerated.

Figure 5:
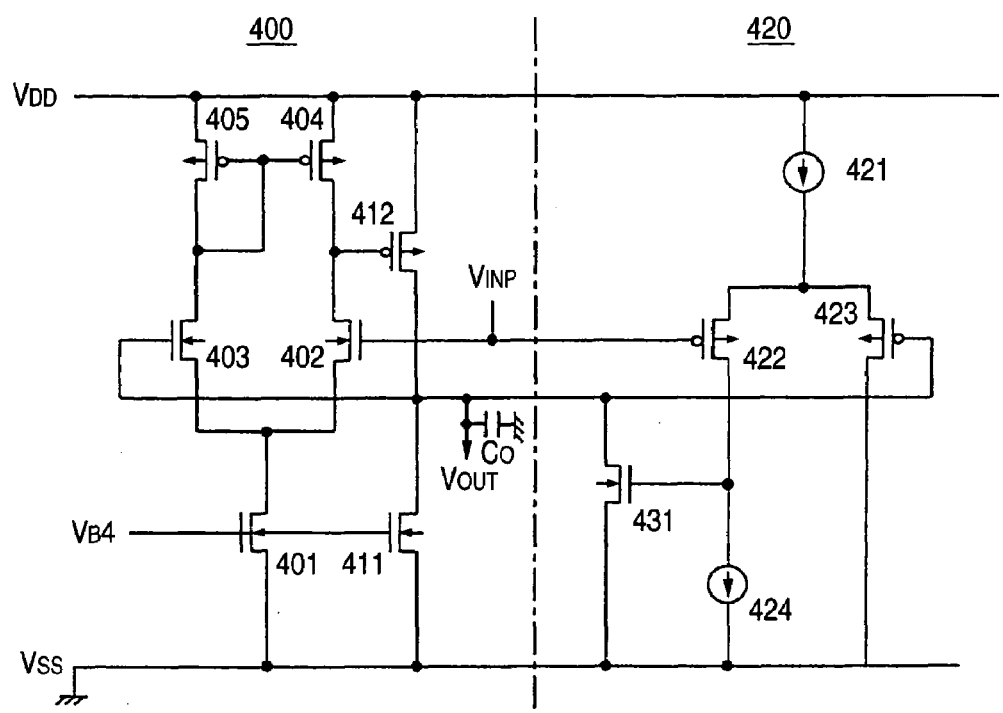
FIG. 5 is a view showing the configuration of a buffer circuit according to a third embodiment of the invention.
Figure 6:
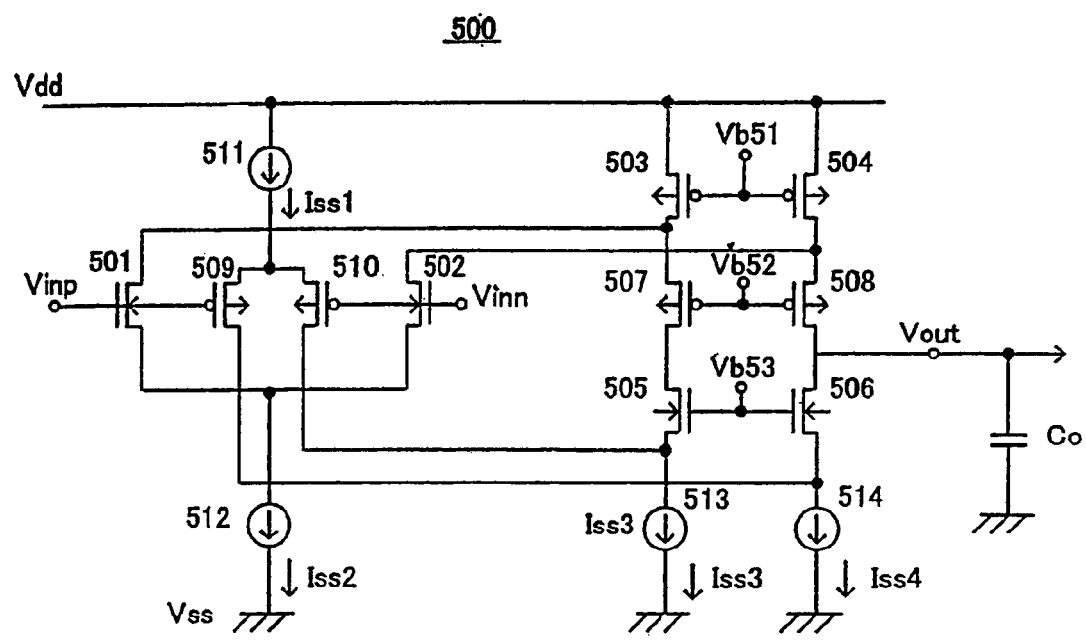
FIG. 6 is a view showing the configuration of a related-art operational amplifier of rail-to-rail type.
Figure 7:
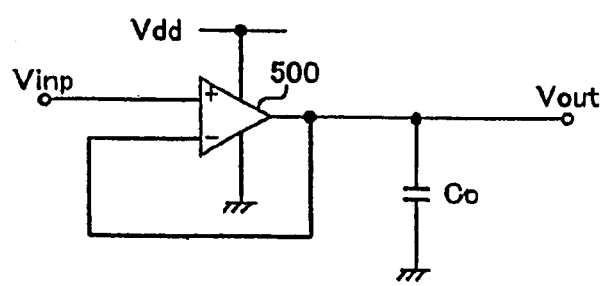
FIG. 7 is a buffer circuit constituted through use of the operational amplifier shown in FIG. 6.
Figure 8A:
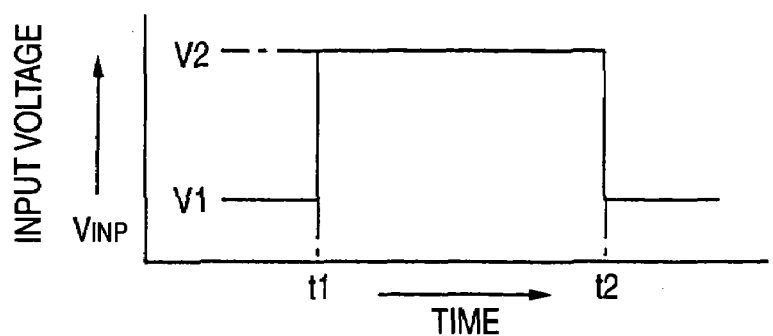
FIGS. 8(a) and 8(b) show the time charts of input and output voltages in the buffer circuit shown in FIG. 7.
Figure 8B:
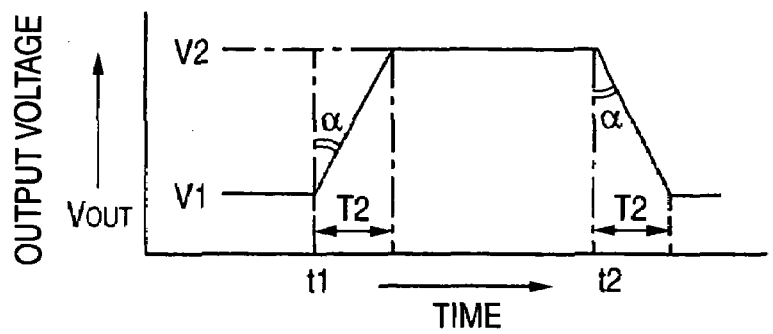

FIG. 5 is a view showing the configuration of a buffer circuit according to a third embodiment of the invention. In the third embodiment, an operational amplifier 400 connected in the form of a voltage follower is configured so as to produce an output current of magnitude limited relative to the fall-side of the output voltage Vout and an electric current which is not substantially limited by the switching circuit relative to the rise-side of the output voltage Vout. The enhancer 420 is configured to accelerate an output solely relative to the fall-side of the output voltage Vout in response to the configuration of the operational amplifier 400. Consequently, an inverse relationship exists between the buffer circuit shown in FIG. 5 and the buffer circuit shown in FIG. 3 in terms of the rise-side and the fall-side.

As shown in FIG. 5, the operational amplifier 400 has a differential amplification circuit made up of MOSFETs 401 to 405, and an output section made up of MOSFETs 411, 412. The input voltage Vinp is input to the non-inverted input terminal, and the output voltage Vout is fed back to the reverse input terminal. A constant bias voltage Vb4 is applied to the gate of the NMOS transistor 401 and the gate of the NMOS transistor 411, and the NMOS transistors 401 and 411 operate as a constant current source. The PMOS transistor 405 and the PMOS transistor 404 constitute a current mirror circuit.

The enhancer 420 has PMOS transistors 422, 423; a differential amplification circuit which is made up of constant current sources 421, 424 and has the offset voltage $\Delta V$; and a switching circuit made up of an NMOS transistor 431. The differential amplification circuit is provided with the offset voltage $\Delta V$ such that a PMOS transistor 422 operates when the input voltage Vinp applied to the gate of the PMOS transistor 422 is smaller than the output voltage Vout applied to the gate of a PMOS transistor 423 by a predetermined offset voltage $\Delta V$.

An inverse relationship also exists between the buffer circuit shown in FIG. 5 and the buffer circuit shown in FIG. 4 in terms of the rise-side and the fall-side. However, the buffer circuit operates in the same manner and can yield the same effect.

Therefore, according to the second embodiment shown in FIG. 4 and the third embodiment shown in FIG. 5, the output voltage Vout is produced immediately in response to a change in the input voltage Vinp, thereby diminishing overall power consumption. Even when the rise-side or fall-side of the output voltage is limited to a small current, the electric currents output from the operational amplifiers 300, 400 can accelerate the output for which the output currents are limited.

ADVANTAGES OF THE INVENTION

A load is commonly driven by means of operational amplification means which is connected in the form of a voltage follower, which buffers an input voltage, and which produces an output voltage; and by means of output acceleration means which outputs a large electric current greater than the electric current output from the operational amplification means when a voltage difference of a predetermined offset voltage or more exists between the input and output voltages. As a result, when a change has arisen in the input voltage, the electric current is supplied to the load primarily from the output acceleration circuit until the difference between the input and output voltages becomes the predetermined offset voltage or less. Subsequently, the electric current is caused to flow to the load from the operational amplification means until the input and output voltages become equal to each other. Consequently, an output voltage is produced quickly in response to a change in input voltage, and entire power consumption can be diminished.

When the electric current output from the operational amplifier is limited to a smaller current value at both the rising and fall-sides of the output voltage or when the rising or fall-side of the output voltage is limited to a small current value, the output for which the output current is limited can be accelerated.

A driver IC is constituted of a plurality of buffer circuits of the invention (e.g., hundreds of buffer circuits). There can be realized a driver IC for use with a source drive of a display device, wherein the driver IC involves low power consumption, has high-capacity driving capability, and enables high-speed response.

What is claimed is:

1. A buffer circuit comprising: operational amplification means which is configured to input an input voltage to a non-inverted input terminal and inputs an output voltage from an output terminal to an inverted input terminal through feedback; and output acceleration means which receives the input voltage and the output voltage as differential inputs and which outputs an electric current larger than a current output from the operational amplification means to the output terminal when a difference between the input voltage and the output voltage exceeds a predetermined offset voltage.

2. The buffer circuit according to claim 1, wherein the output acceleration means has a differential amplification section having the predetermined offset voltage, and a switching section which is connected between a source potential and the output terminal and is activated or deactivated in accordance with an output from the differential amplification section.

3. The buffer circuit according to claim 2, wherein the differential amplification section has a first differential amplification circuit which produces a first output when the input voltage is higher than the output voltage by an amount corresponding to a first offset voltage, and a second differential amplification circuit which produces a second output when the output voltage is higher than the input voltage by an amount corresponding to a second offset voltage; and wherein the switching section has a first switching circuit which is connected between a first source potential and the output terminal and is activated or deactivated in accordance with the first output, and a second switching circuit which is connected between the output terminal and a second source potential and is activated or deactivated in accordance with the second output.

4. The buffer circuit according to claim 2, wherein the operational amplification means is formed such that an electric current output from a first source potential to the output terminal is limited to a predetermined current value and such that an electric current output from the output terminal to a second source potential flows by way of the switching circuit; and wherein the output acceleration means has a differential amplification section having the predetermined offset voltage and a switching section which is connected between the first source potential and the output terminal and is activated or deactivated in accordance with an output from the differential amplification section.

5. The buffer circuit according to claim 1, wherein said buffer circuit is used for at least any one of a plurality of buffer circuits which is used for a driver IC.

6. The buffer circuit according to claim 1, wherein said operational amplification means is an operational amplifier which includes a plurality of constant current sources.

* * * * *